US005187859A

United States Patent [19]

Heim

[11] Patent Number: 5,187,859

[45] Date of Patent: Feb. 23, 1993

[54] METHOD OF PRELOADING SUPERCONDUCTING COILS BY USING MATERIALS WITH DIFFERENT THERMAL EXPANSION COEFFICIENTS

[75] Inventor: Joseph R. Heim, Livermore, Calif.

[73] Assignee: The United States of America as represented by the United States Department of Energy, Washington, D.C.

[21] Appl. No.: 571,361

[22] Filed: Aug. 23, 1990

[51] Int. Cl.[5] .............................................. H01L 39/24

[52] U.S. Cl. ......................................... 29/599; 29/605

[58] Field of Search ................. 29/599, 447, 452, 605; 335/216

[56] References Cited

U.S. PATENT DOCUMENTS

| | | | |
|---|---|---|---|
| 1,982,852 | 12/1934 | Bergstrom et al. | 29/447 X |
| 4,271,585 | 6/1981 | Satti | 29/599 |
| 4,377,905 | 3/1983 | Agatsuma et al. | 29/599 |
| 4,727,346 | 2/1988 | Westphal et al. | 335/216 |

OTHER PUBLICATIONS

Design and Analysis of a Superconducting Cable-In-Conduit Test Coil For Operation At 15 T and 40 A-mm-2 J. R. Heim et al.

*Primary Examiner*—Joseph M. Gorski

*Attorney, Agent, or Firm*—Henry P. Sartorio; Roger S. Gaither; William R. Moser

[57] ABSTRACT

The invention provides a high magnetic field coil. The invention provides a preloaded compressive force to the coil maintain the integrity of the coil. The compressive force is obtained by reinforcing the coil with two materials of different thermal expansion rates and then heating the coil to 700° C. to obtain the desired compression. The embodiment of the invention uses $Nb_3Sn$ as the conducting wire, since $Nb_3Sn$ must be heated to 700° C. to cause a reaction which makes $Nb_3Sn$ superconducting.

19 Claims, 4 Drawing Sheets

METHOD OF PRELOADING SUPERCONDUCTING COILS BY USING MATERIALS WITH DIFFERENT THERMAL EXPANSION COEFFICIENTS

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

In the prior art a common type of electrical coil is the layer-wound solenoid coil, illustrated in FIG. 1. Typically, this type of coil is fabricated by layer-winding electrical conductor 10 onto the outside of a winding cylinder 12 much the same as sewing thread or yarn is layer-wound onto a bobbin. Coil winding is usually done by mechanically rotating the winding cylinder 12 and guiding the conductor 10 onto the surface of the cylinder with the conductor 10 advancing one conductor width per revolution. When the surface of the winding cylinder 12 is covered by conductor 10, the first layer 14 is complete and the second layer 16 is wound on top of the first layer 14. The winding cylinder is rotated in the same direction for the second layer 16, but the conductor 10 advances in the opposite direction so that the second layer 16 ends at the same end of the coil as where the first layer started. Coil winding continues in this manner by winding from end-to-end and progressing from layer-to-layer with the radius of each new coil layer one conductor thickness larger than the last layer.

One of the conditions for constructing a good electrical coil is that the current must flow along the electrical conductor 10. This requirement is met by using electrical insulation between conductors to prevent turn-to-turn and layer-to-layer shorts. The electrical insulation is usually applied to the conductor before winding, but in some cases the electrical insulation is done in two stages. The first stage is to insulate the surface of the conductor so that the bare metal surfaces of adjacent conductors do not contact during the coil-winding process. For this example, the first stage is accomplished by wrapping the bare conductor with high-temperature glass tape 18. The porous glass tape 18 serves as a spacer between coil turns during winding and it becomes a reinforcement to the epoxy in the second stage. The second stage of electrical insulation is to vacuum impregnate the coil winding with a thermoset epoxy The epoxy impregnation fills all of the voids in the coil winding, which includes the voids in the glass tape 18. The thermoset is then cured to bond the coil winding into a monolithic coil structure.

The coil construction shown in FIG. 1 has been used to build conventional water-cooled electromagnets for many years. These methods work well for low-current-density/low-field coils, but they are lacking in adequate structure for high-current-density/high-field coils. The following discussion describes the Lorentz forces that are generated inside the windings of a solenoid magnet and considers the trade-off choices that can be used to design a good reinforcement structure to react the Lorentz forces.

When a current flows through an electrical coil, a magnetic field is generated and the current-carrying coil conductors are affected by this magnetic field. The current-carrying conductors experience electromagnetic forces due to the magnetic field, and these electromagnetic forces are called Lorentz forces. For solenoid coils, the dominant Lorentz forces are directed radially outward, and they are applied to the coil conductor. Axial Lorentz forces which are directed inward are also applied to coil conductors near the ends of the solenoid coil, but effects of these forces are easier to negate with coil structure. This discussion is a treatment of the more difficult radial Lorentz forces only.

The electrical insulation used between adjacent coil turns is not a good structural material. The insulation is often reinforced with glass or similar fibers, but the insulation-to-conductor epoxy bond is left as the weak link in the structure. The lack of confidence in the conductor-to-insulation bond in superconducting magnets is particularly worrisome. Superconducting magnets are cooled to 4°-5° K. for operation, and insulation materials tend to become brittle at these low temperatures. Furthermore, insulations typically shrink more than conductor materials, and the cooldown differential contraction tends to load the insulation-to-conductor epoxy bonds into tension. Also, for thick solenoids with outside-to-inside radius ratios greater than 1.85, the radial stress distribution due to Lorentz forces changes from compression to tension and the conductor-to-insulation bond in the radial direction is loaded in tension. This tension loading in the insulation-to-conductor bond is not acceptable for magnets that must work reliably. A failure of this bond can lead to insulation damage, followed by layer-to-layer shorts. This lack of confidence in the conductor to-insulation bonds to carry tension has led to the adoption of an engineering design requirement for some superconducting magnet applications of no tension allowed in the insulation-to-conductor epoxy bonds.

Insulation-to-conductor epoxy-bond tensile stresses may be eliminated by preloading. If the bond is preloaded into compression, tension excursions that follow the preloading will reduce the compression loading. If the coil is preloaded into compression and the conductor-to-insulation compression preloading is greater than the tension loading due to cooldown or Lorentz forces, the conductor-to-insulation-bond stresses will remain in compression. Therefore, the coil must be preloaded into compression to an amount greater than the magnitude of the tension excursions that follow if insulation-to-conductor epoxy-bond tensile stresses are to be eliminated.

One method of accomplishing preloading in the radial direction is to wind the coil with tension in the conductor. The conductor is stretched as it is being wound onto the coil, and this stretching develops radial compression between coil layers when the conductor is in place. This technique has also been used to fabricate cylindrical pressure vessels. If the outside of a cylinder is wrapped with material which is stretched during winding, the bore of the cylinder is preloaded into compression and the allowable operating pressure of the vessel is higher than a solid cylinder of the same thickness.

A second method of accomplishing preloading in the radial direction is to shrink a cylindrical jacket onto the outside of the coil. This technique works well for conventional coils which operate near room temperature, and it has also been used to shrink the field-shaping iron onto the outside of superconducting coils. This shrink-fit method has also been used for many years to build high-pressure vessels and gun barrels. The inside cylinder or coil is cooled to decrease its outside diameter or the outside cylinder is heated to increase its inside diameter. In some cases, both heating of the outside jacket and cooling of the inside cylinder is used to accomplish a maximum interference between cylinders. When both cylinders are in the ready-to-assemble condition, the outside diameter of the inner cylinder is smaller than the inside diameter of the outer cylinder. The cylinders are then assembled together and allowed to warm up to room temperature. At room temperature, both cylinders are preloaded into compression in the radial direction.

A third method of accomplishing preloading in the radial direction is similar to the shrink-jacket method described above. This differential contraction of materials method works well for devices that operate at a temperature which is different than the fabrication temperature. The shrink-fit method uses expansion and contraction due to temperature differences to develop an interference fit during the assembly process to develop radial preloading. The differential contraction of materials method uses different materials with different expansion coefficients to accomplish radial preloading. This method works well for superconducting coils in that assembly takes place at room temperature, and the operating temperature is 4°-5° K. This temperature excursion, referred to as cooldown, has been used to accomplish radial preloading of superconducting coils.

The three methods described above to accomplish preloading in the radial direction may also be used in combination. If the operating temperature is different than the fabrication temperature, the preload methods used for fabrication may be combined with the differential contraction of materials to maximize the preloading in the radial direction.

Some superconducting materials are brittle. To form these materials into a coil, the materials are formed into a ductile nonsuperconducting wire. The wire is wound into a coil, and then the coil is heated causing a reaction making the wire superconducting and brittle.

There is a need to provide a higher compressive preloading in the radial direction for superconducting coils which use brittle superconducting materials which must be reacted after winding and which are used in a coil to produce high magnetic fields.

SUMMARY OF THE INVENTION

It is an object of the invention to provide a method of preloading coils of a superconductor which must be heated after winding.

It is another object of the invention to provide higher preloading of a superconducting coil.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The following method of radial preloading superconducting coils by using materials with different thermal expansion coefficients is different than the preceding descriptions in that the coil fabrication techniques are somewhat different and the temperature excursion is greater. This method of preloading in the radial direction works well in combination with a coil fabrication technique called the insulate-wind-react-impregnate method.

The invention provides a coil which uses cable-in-conduit winding. The walls of the cable-in-conduit are of a first steel material. The cable-in-conduit are wound as described above like other coils. In the outer layers of the coils a layer of a second steel material is wound between the layers of cable-in-conduit. The coil is heated to above 300° C. The first steel material has a lower thermal expansion than the second steel material. As the coil is cooled to room temperature the difference in thermal expansions between the first and second steel materials provides a compressive loading. As the coil is cooled to superconducting temperature the difference in thermal expansions between the first and second steel material provides additional compressive loading.

DETAILED DESCRIPTION OF THE INVENTION

In this embodiment of the invention the superconducting material is niobium tin ($Nb_3Sn$), which is ductile in the unreacted condition, but brittle in the reacted condition. This material is also strain sensitive in that its current-carrying capability is highest in the unstrained condition. The wires of $Nb_3Sn$ in the unreacted condition are formed by placing solid rods of niobium and tin in bores of a copper matrix. The copper matrix is then drawn down to form a wire. To avoid damage and residual strains due to the winding process, the coil is first wound with wires of $Nb_3Sn$ in the unreacted condition and then the $Nb_3Sn$ is reacted to become a superconductor. The $Nb_3Sn$ is reacted by putting the coil into a furnace with an inert gas environment and heating the coil to approximately 700° C. All of the materials used to wind the superconducting coil must survive the high temperature reaction-heat-treatment process.

Figure 2:
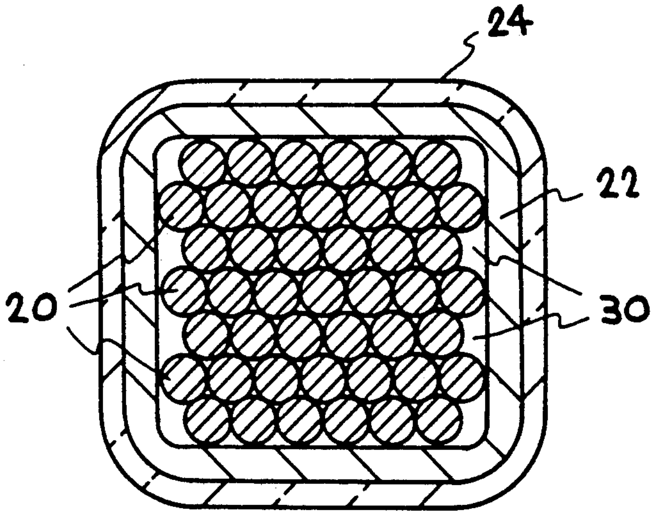
FIG. 2 illustrates a cross section of a low field cable-in-conduit used in the preferred embodiment of the invention.
Figure 3:
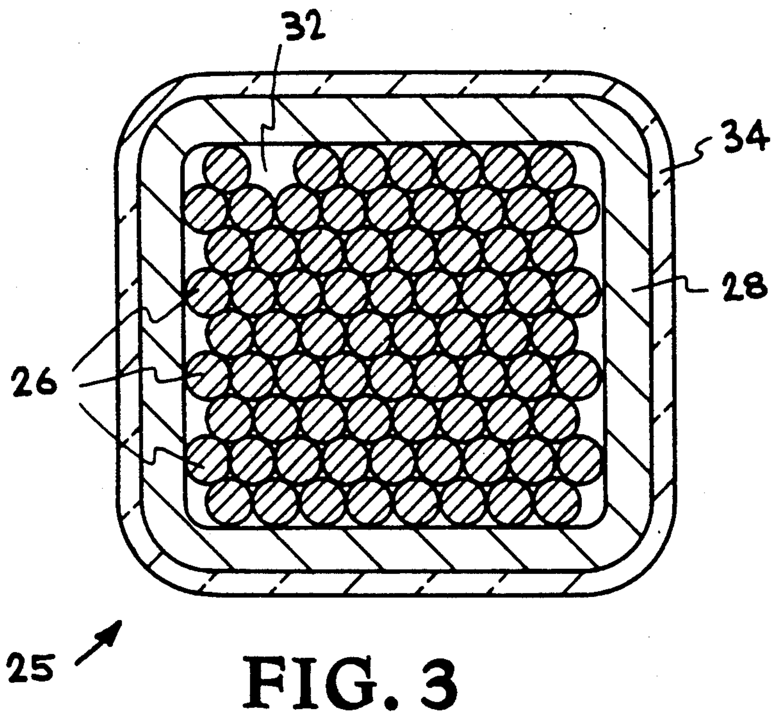
FIG. 3 illustrates a cross section of a high field cable-in-conduit used in the preferred embodiment of the invention.

FIGS. 2 and 3 illustrate cross-sections of the cable-in-conduits used in this embodiment of the invention. FIG. 2 illustrates an unreacted $Nb_3Sn$ cable-in-conduit fabricated using 45 wires 20 forming a cable. The cable is surrounded by walls 22 of Incoloy 908 steel, which form a square conduit. The conduit is wrapped with a high-temperature glass or ceramic tape 24. This 45 wire cable-in-conduit is used for the low field region of the inventive coil. FIG. 3 illustrates unreacted $Nb_3Sn$ cable-in-conduit fabricated using 75 wires 26 forming a cable. The cable is surrounded by walls 28 of Incoloy 908 steel, which form a square conduit. The conduit is wrapped with a high-temperature glass or ceramic tape 34. This 75 wire cable-in-conduit is used for the high field region of the inventive coil. The wrapping of the high-temperature glass or ceramic tape onto the conductor as part of the coil winding forms the first stage of providing insulation between the coil windings. The insulation acts as a spacer to separate electrical conductors during coil winding. The tape is porous so that it can later be impregnated with epoxy. Within the walls of the conduit and the cable are voids 30,32 through which helium can flow.

Figure 1:
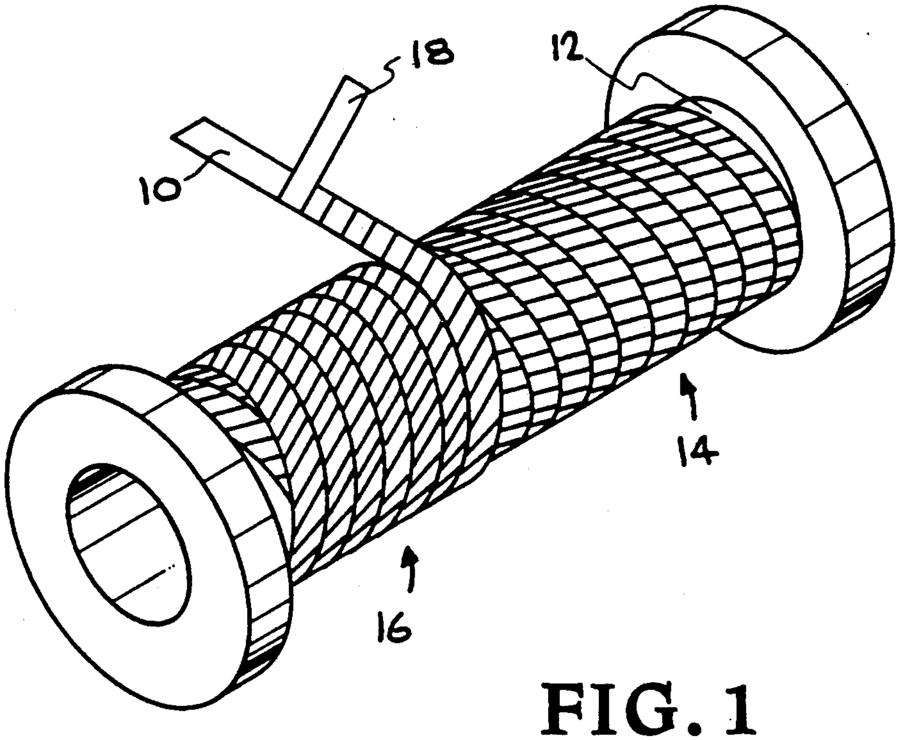
FIG. 1 (PRIOR ART)
FIG. 1 illustrates a coil being wound using prior art techniques.
Figure 4:
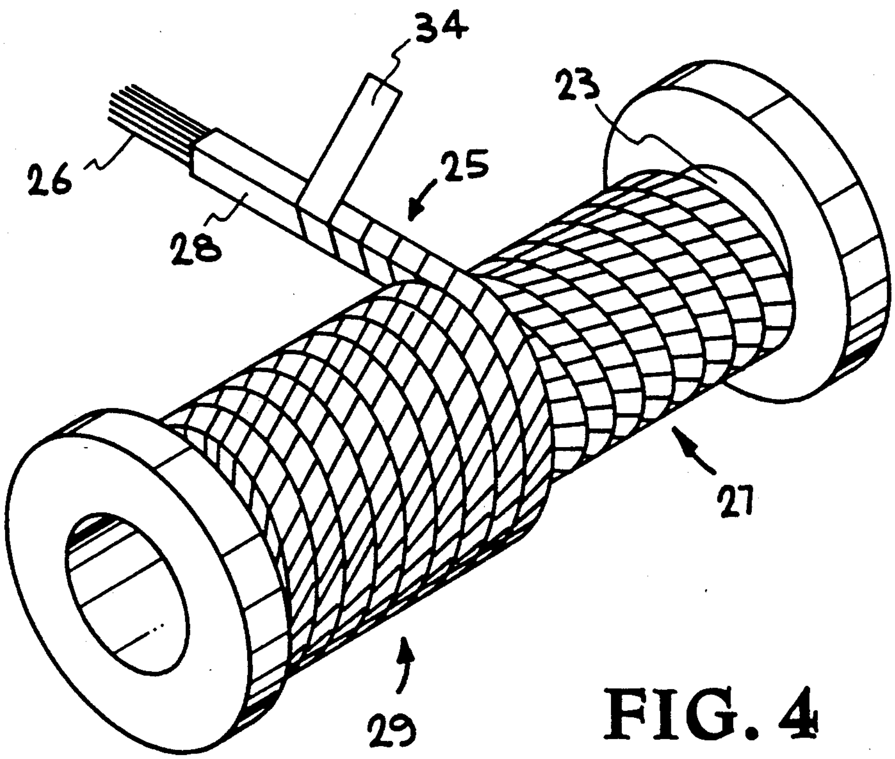
FIG. 4 illustrates a coil being wound with a second layer of the low field cable-in-conduit forming a coil of the preferred embodiment of the invention.

The 75 wire high field cable-in-conduit 25 is wrapped on a winding cylinder 23 as illustrated in FIG. 4. FIG. 4 illustrates a cut away view of the high field cable-in-conduit 25, illustrating the cable 26 which is surrounded by the conduit 28. A glass or ceramic tape 34 is wrapped around the conduit 28. As in the technique illustrated in FIG. 1 the winding is accomplished by mechanically rotating the winding cylinder 23 and guiding the cable-in-conduit 25 onto the surface of the cylinder 23 with the cable-in-conduit 25 advancing one cable-in-conduit width per revolution. When the surface of the winding cylinder 23 is covered by cable-in-conduit 25, the first layer 27 is complete and the second layer 29 is wound on top of the first layer 27. The winding cylinder 23 is rotated in the same direction for the second layer 29, but the cable-in-conduit 25 advances in the opposite direction so that the second layer 29 ends at the same end of the coil as where the first layer started. In this embodiment the high field cable-in-conduit 25 is wound on the winding cylinder 23 in 10 layers with 50 turns per layer. Less than 50 turns per layer are illustrated in FIG. 4 for clarity.

Once the 10 layers of the the high field cable-in-conduit is wound the outer end of the high field cable is spliced to an end of the low field cable and a layer of the low field cable-in-conduit is wound on the cylinder. Since the low field cable-in-conduit is smaller than the high field cable-in-conduit, there are 61 turns in a layer of the low field cable-in-conduit.

Figure 5:
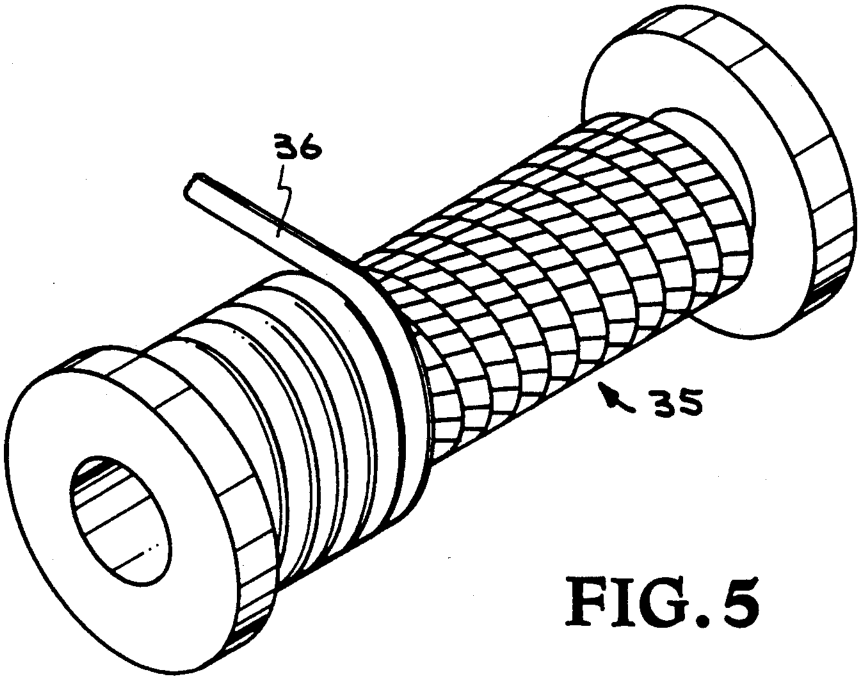
FIG. 5 illustrates the first layer of A286 steel being wound to form a coil of the preferred embodiment of the invention.

Once the first layer of the low field cable-in-conduit is wound, a layer of high expansion A286 steel is wound over the first layer 35 of the low field cable-in-conduit as illustrated in FIG. 5. FIG. 5 illustrates how the A286 steel is in the form of a cable 36 and is spiral wrapped onto the coil much the same as the cable-in-conduit. Using a cable 36 spirally wound instead of a solid rectangular steel sheet wrapped around the coil, inhibits eddy currents generated by the coil. There are 61 turns per layer of the A286 steel. Less than 61 turns per layer are shown for clarity.

A second layer of low field cable-in-conduit is wound over the first layer of A286 steel, and then a second layer of A286 steel is wound over the second layer of low field cable-in-conduit. The layers are alternated until there are 12 layers of the low field cable-in-conduit and 12 layers of A286 steel, making the outermost layer of the coil the twelfth layer of the A286 steel.

Figure 6:
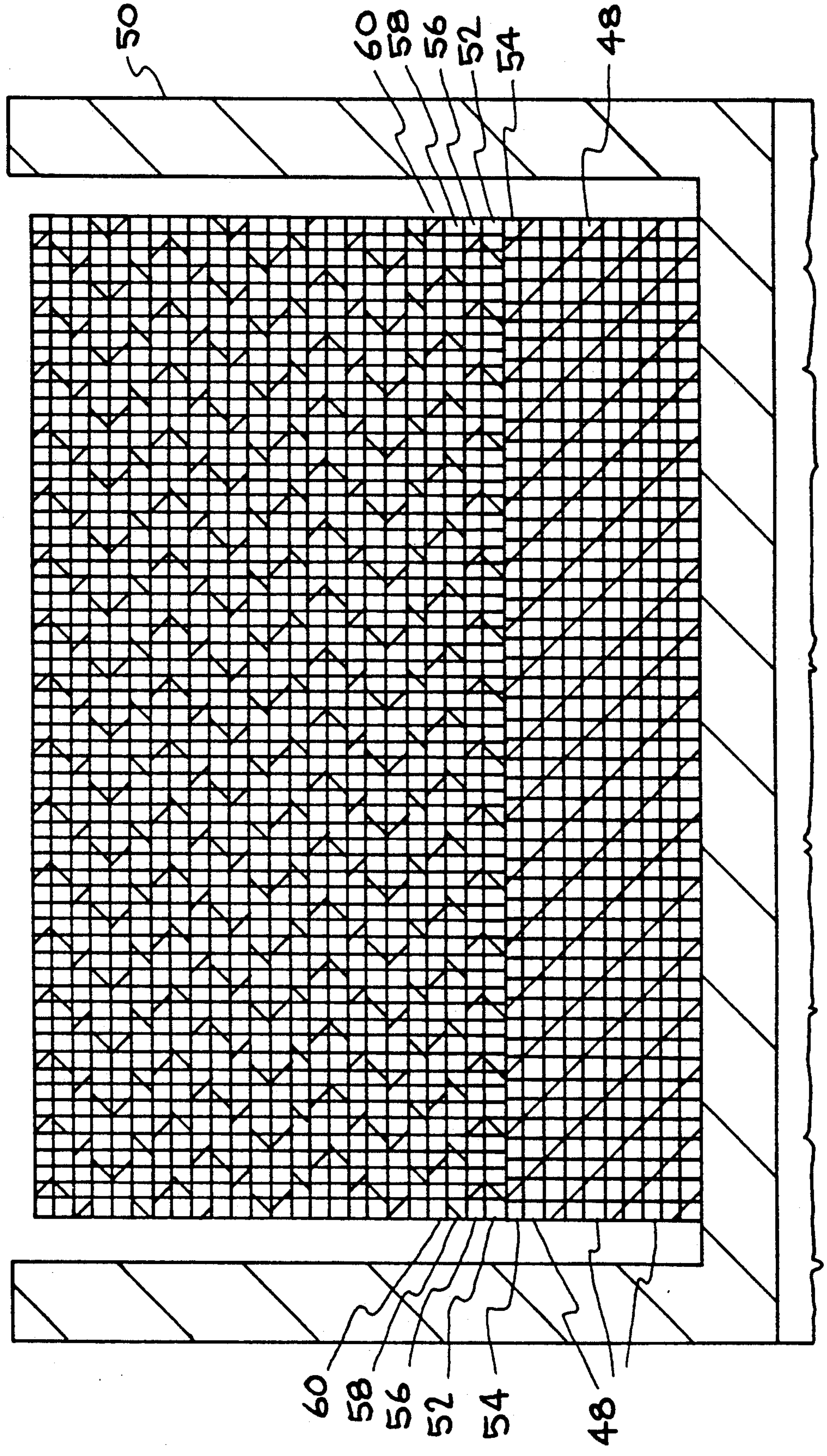
FIG. 6 illustrates a cross section of a coil of the preferred embodiment of the invention.

FIG. 6 illustrates a half of a cross section of a fully wound coil of the preferred embodiment. Ten layers of high field cable-in-conduit 48 are wound on a winding cylinder 50, with fifty turns per layer. A first layer 52 of low field cable-in-conduit is wound on the tenth layer 54 of high field cable-in-conduit. A first layer 56 of A286 steel is wound on the first layer 52 of low field cable-in-conduit. A second layer 58 of low field cable-in-conduit is wound on the first layer 56 of A286 steel. A second layer 60 of A286 steel is wound on the second layer 58 of low field cable-in-conduit. The layers of low field cable-in-conduit and A286 are alternately wound until twelve layers of low field cable-in-conduit and twelve layers of A286 steel are wound. In this embodiment as mentioned before, there are 61 turns in each layer of low field cable-in-conduit and A286 steel.

The fully wound coil is heated to a temperature of 700° C. The heat causes the ductile unreacted $Nb_3Sn$ wire to react forming a brittle $Nb_3Sn$ superconducting wire. When the coil is heated to the reaction temperature, the high expansion, reinforcement A286 steel will unload in tension and load into compression. The amount of compression developed will be dependent upon the type of fixturing used to constrain the coil. When the coil is cooled back down to room temperature, the reinforcement tension will return, due to differential contraction. The magnitude of the reinforcement tension at room temperature will also depend upon the type of fixturing being used to constrain the coil and the magnitude of the compressive load at 700° C. Cooling down the coil of the preferred embodiment from reactive temperatures to 4° K. causes a compressive stress up to 40 MPa.

After the coil is reacted and cooled to room temperature, the second stage of the electrical insulating is performed. The second stage of electrically insulating the coil is to vacuum impregnate the porous glass or ceramic tape with epoxy. The epoxy fills all of the voids in the porous tape and the tape/epoxy becomes a good composite insulating material when the epoxy is cured. The glass or ceramic fibers in the tape serve as reinforcement to the epoxy with a significant improvement in the tension mechanical properties in the fiber direction. However, the tension mechanical properties of the insulation composite in the normal-to-tape direction are not significantly improved and the insulation-to-conductor bond is basically an epoxy bond only. These bonds are poor structure bonds for tension loading.

When the completed coil is cooled down from furnace temperature to 4°-5° K., the A286 steel contracts more than the conduit and preloads the coil into radial compression.

Figure 7:
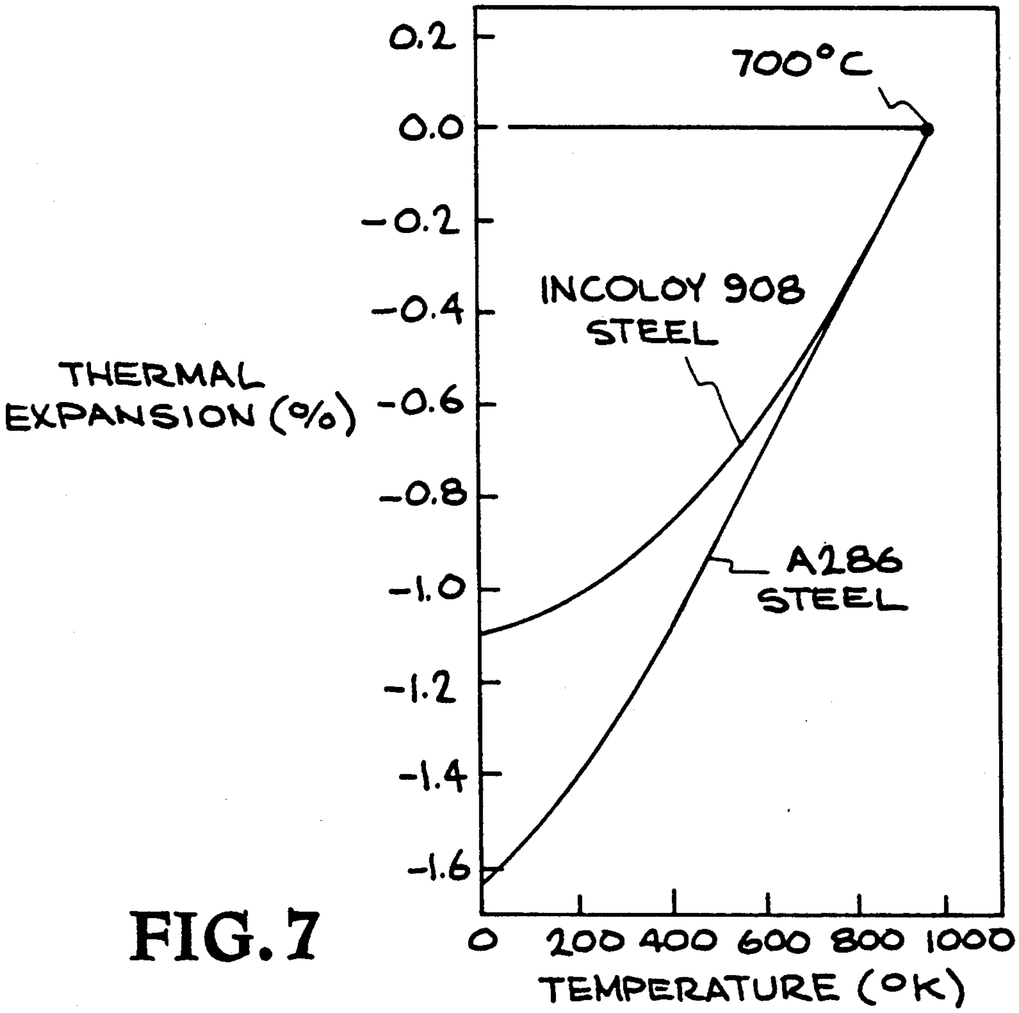
FIG. 7 is graph of the thermal expansion of Incoloy 908 steel and A286 steel with respect to temperature.

A good selection of materials is Incoloy 908 low-expansion steel for the conductor conduit and A286 high-expansion steel for the reinforcement. Both of these steels are high-strength precipitation-hardening steels with age-hardening heat-treatment cycles that are compatible with the $Nb_3Sn$ superconductor reaction heat treatment. The differential contraction between these steels for a temperature excursion from a furnace temperature of approximately 700° C. to an operating temperature of 4°-5° K. is about 0.5% strain, as shown in FIG. 7. This contraction of the reinforcement with respect to the coil preloads the coil into radial compression on cooldown. This radial preload can be used to maintain radial compression in the insulation-to-conductor epoxy bonds so that tension may be eliminated in these epoxy bonds.

In operation of the coil of the preferred embodiment, helium passes through the coil under forced flow, cooling the coil to a temperature of 4°-5° K. The coil of the preferred embodiment produces a magnetic field of 15 Telsa using a current density of 40 $A/mm^2$ in the coil.

The foregoing description of preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method of manufacturing a superconducting coil, comprising the steps of:

surrounding wire which becomes superconducting upon subsequent heating with a first reinforcing material with a thermal expansion rate;

surrounding the wire and first reinforcing material with electrical insulation;

winding the wire surrounded by first reinforcing material and electrical insulation on a winding means thereby providing a first plurality of layers with an outer layer;

winding a cable of a second reinforcing material, with a thermal expansion rate greater than the thermal expansion rate of the first reinforcing material, around the outer layer of the first plurality of layers so that a first layer of the cable of the second reinforcing material is formed around the first plurality of layers;

winding a layer of the wire surrounded by first reinforcing material and electrical insulation around the first layer of cable of the second reinforcing material;

winding a second layer of the second reinforcing material around the layer of wire around the first layer of cable of the second reinforcing material;

whereby a coil is formed;

heating the coil to a temperature greater than 300° C. thereby making the wire superconducting; and cooling the coil to a temperature equal to or less than room temperature;

whereby the coil is radially preloaded.

2. The method as claimed in claim 1, wherein the wire comprises a plurality of wire components formed into a cable.

3. The method as claimed in claim 2, wherein the surrounding of the wire with the first reinforcing material is accomplished by placing the cable in a conduit wherein the walls of the conduit are made of the first reinforcing material.

4. The method as claimed in claim 3, wherein the surrounding of the wire and first reinforcing material with insulation comprises wrapping a glass or ceramic tape around the conduit.

5. The method as claimed in claim 4, wherein the surrounding of the wire and first reinforcing material with insulation further comprises impregnating the insulation with epoxy.

6. The method as claimed in claim 5, wherein the glass or ceramic tape is porous.

7. The method as claimed in claim 1, wherein the surrounding of the wire and first reinforcing material with insulation comprises wrapping a glass or ceramic tape around the wire and first reinforcing material.

8. The method as claimed in claim 7, wherein the surrounding of the wire and first reinforcing material with insulation further comprises impregnating the insulation with epoxy.

9. The method as claimed in claim 8, wherein the glass or ceramic tape is porous.

10. The method as claimed in claim 1, wherein the wire is made of a plurality of unreacted metals.

11. The method as claimed in claim 10, wherein the heating of the coil to a temperature greater than 300° C. reacts the plurality of unreacted metals to make the wire superconducting.

12. The method as claimed in claim 11, wherein the superconducting wire is $Nb_3Sn$ and wherein the coil is heated to a temperature substantially equal to or greater than 700° C.

13. The method as claimed in claim 12, wherein the wire comprises a plurality of wire components formed into a cable.

14. The method as claimed in claim 13, wherein the surrounding of the wire with the first reinforcing material is accomplished by placing the cable in a conduit wherein the walls of the conduit are made of the first reinforcing material.

15. The method as claimed in claim 14, wherein the surrounding of the wire and first reinforcing material with insulation comprises wrapping a glass or ceramic tape around the conduit.

16. The method as claimed in claim 15, wherein the surrounding of the wire and first reinforcing material with insulation further comprises impregnating the insulation with epoxy.

17. The method as claimed in claim 16, wherein the glass or ceramic tape is porous.

18. The method as claimed in claim 17, wherein the first reinforcing material is Incoloy 908 steel and the second reinforcing material is A286 steel.

19. The method as claimed in claim 18, including performing each of the winding steps until there are at least 12 alternating layers of the wire surrounded by the first reinforcing material, and the second reinforcing material.

* * * * *